(12) United States Patent
Kochsiek

(10) Patent No.: US 9,087,992 B2
(45) Date of Patent: Jul. 21, 2015

(54) SHAFT-HUB CONNECTION

(75) Inventor: Guido Kochsiek, Leopoldshoöhe (DE)

(73) Assignee: IPROTEC MASCHINEŃ- UND EDELSTAHLPRODUKTE GMBH, Petershagen-Friedewalde (DE)

( * ) Notice: Subject to any disclaimer, the term of this patent is extended or adjusted under 35 U.S.C. 154(b) by 0 days.

(21) Appl. No.: 12/933,372

(22) PCT Filed: Mar. 19, 2009

(86) PCT No.: PCT/EP2009/002024
§ 371 (c)(1),
(2), (4) Date: Dec. 21, 2010

(87) PCT Pub. No.: WO2009/115326
PCT Pub. Date: Sep. 24, 2009

(65) Prior Publication Data
US 2011/0116863 A1    May 19, 2011

(30) Foreign Application Priority Data
Mar. 20, 2008  (EP) .................. 08005316

(51) Int. Cl.
*B25G 3/28* (2006.01)
*B25G 3/02* (2006.01)
*H01L 51/00* (2006.01)
*F16D 1/072* (2006.01)
*H01L 51/05* (2006.01)
*F16D 1/10* (2006.01)

(52) U.S. Cl.
CPC ............ *H01L 51/0043* (2013.01); *F16D 1/072* (2013.01); *F16D 2001/102* (2013.01); *H01L 51/0529* (2013.01)

(58) Field of Classification Search
USPC .................. 403/274, 360, 359.1, 359.2, 383
See application file for complete search history.

(56) References Cited

U.S. PATENT DOCUMENTS

| 5,632,684 A | 5/1997 | Kumar et al. |
| 2002/0168222 A1 | 11/2002 | Simons et al. |
| 2002/0197104 A1 * | 12/2002 | Bauman et al. ............... 403/274 |
| 2002/0198075 A1 | 12/2002 | Prucher |
| 2005/0172755 A1 * | 8/2005 | Burgler ........................... 74/567 |

FOREIGN PATENT DOCUMENTS

| CN | 1666027 A | 9/2005 | |
| DE | 10234613 A1 | 2/2004 | |
| EP | 1693587 A2 * | 8/2006 | ............... F16D 7/02 |

OTHER PUBLICATIONS

Chinese Office Action Application No. 200980109996.7; May 20, 2013.

* cited by examiner

*Primary Examiner* — Daniel P Stodola
*Assistant Examiner* — Jonathan Masinick
(74) *Attorney, Agent, or Firm* — Sughrue Mion, PLLC

(57) ABSTRACT

A shaft-hub connection having a hub seat (2), which is provided by the shaft (1), and a hub of a component (5), which is received by the hub seat (2), wherein the hub seat (2) and the hub of the component (5) implement a polygonal connection. In order to provide a shaft-hub connection which is optimized in particular in regard to the force introduction into the shaft, it is proposed by the invention that the hub seat (2) has at least one radial projection (9, 10) in the longitudinal direction (11) of the shaft (1).

7 Claims, 5 Drawing Sheets

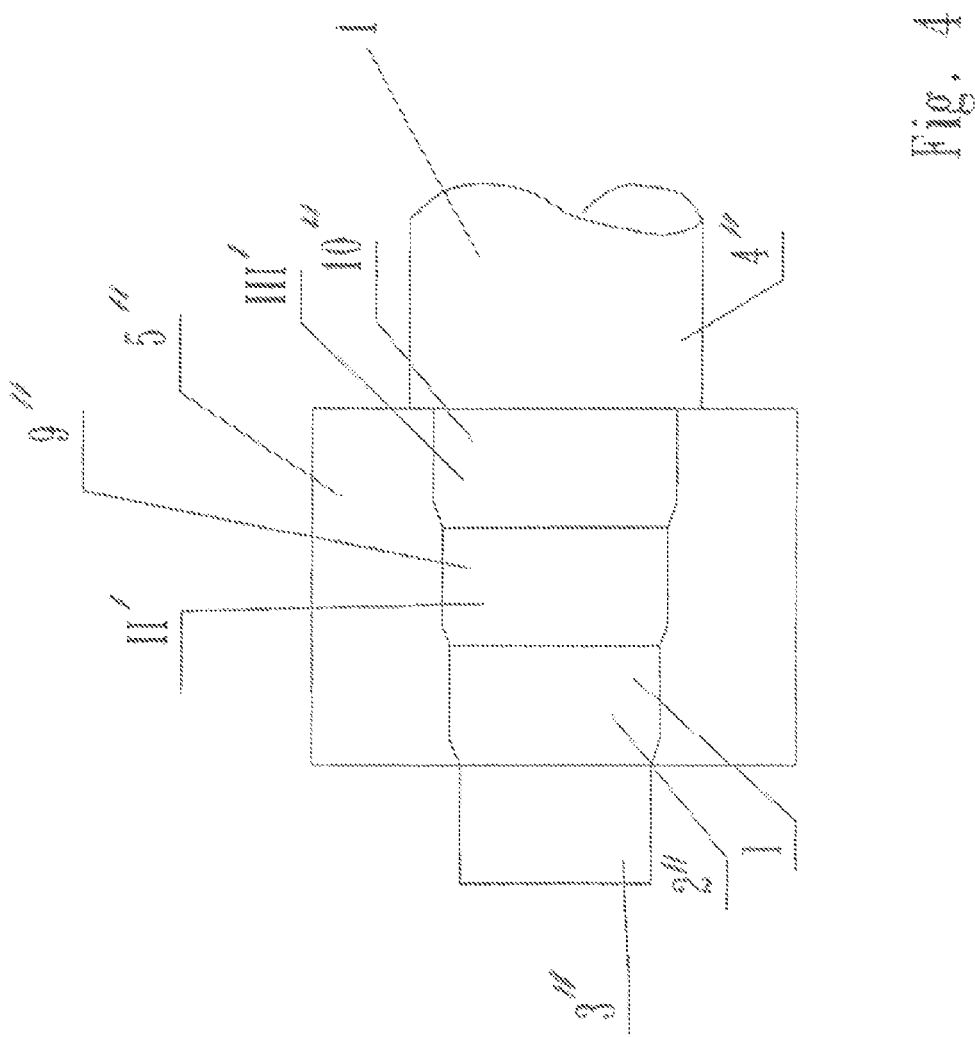

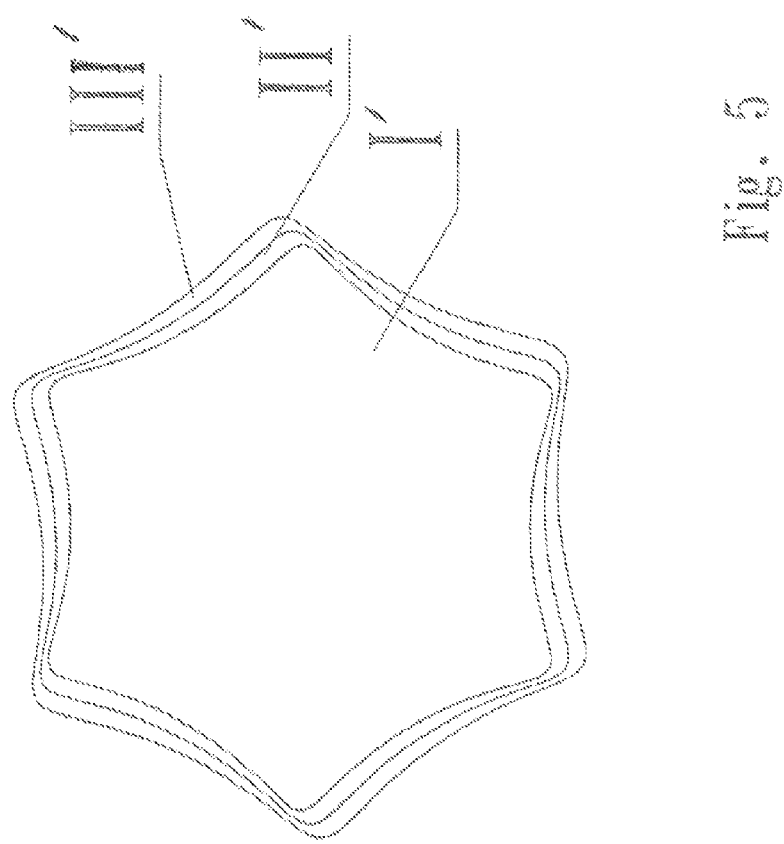

SHAFT-HUB CONNECTION

CROSS REFERENCE TO RELATED APPLICATIONS

This application is a National Stage of International Application No. PCT/EP2009/002024 filed Mar. 19, 2009, claiming priority based on European Patent Application No. 08005316.8 filed Mar. 20, 2008, the contents of all of which are incorporated herein by reference in their entirety.

BACKGROUND OF THE INVENTION

1. Field of the Invention

The invention relates to a shaft-hub connection having a hub seat provided by a shaft and a hub of a component, which is received by the hub seat, wherein said hub seat and said hub of said component form a non-round connection.

2. Background

"Non-round connection" in the sense of the present application comprises all shaft-hub connections which are not circular, hence ellipses, polygons, tooth systems, asymmetric polygons and the like. In the following, the so called "polygonal connection" will always be used as working term. As far as "polygonal connections" are concerned in the following, generally all possible non-round connections will always be meant and comprised.

From the state of the art, numerous and multiform connections of shafts, axes and cogs to hubs of components, such as for instance running wheels, toothed wheels, eccentric wheels, levers and/or like components are known. These ones can be grouped according to the way of the load transmission into positive connections, frictionally engaged connections, pre-stressed positive connections and firmly bonded connections. In positive connections the connection between shaft and hub is established by a certain shaping, such as for instance by a spline profile, a groove toothing or a polygonal profile or by additional elements which have to be designated as "dogs", such as for example feather keys, sliding keys or cross pins.

Being positive connections, polygonal connections are in particular suitable for transmitting intermittent torques and are in particular provided for separable connections, sliding seats and press fits. Polygonal connections are furthermore self-centering, i.e. an eventually existent free motion is symmetrically compensated during a rotation. Furthermore, polygonal connections are in many cases more favorable with respect to the notch effect than other positive connections.

Although positive shaft-hub connections and in particular polygonal connections have proved to be a success in daily practical use, there is still a demand for improvement. Therefore, it is the object of the invention to propose a shaft-hub connection of the initially mentioned type which is improved with respect to the state of the art and which is in particular optimized with respect to the force introduction into the shaft. Furthermore, the connection shall be simplified with respect to the production and/or the assembly.

SUMMARY OF THE INVENTION

For the solution of this problem the invention proposes that the shaft-hub connection comprises at least one radial shoulder in the longitudinal direction of the shaft.

The shaft-hub connection shall at least comprise one radial shoulder. This comprises that at least one radial step is formed in one of the two components, i.e. on the hub seat on the side of the shaft or on the hub of the component. The hub seat respectively the hub can comprise cylindrical and/or conical sections. By "radial shoulder" or radial step an orthogonal or also a conical as well as a rounded graduation course can be understood.

In the polygonal connections between shaft and hub which are known from the state of the art it is provided that the hub seat comprises polygonal surfaces which are respectively placed in one plane in the longitudinal direction of the shaft. In contrast to this, the invention now proposes that the connection, hence for example the hub seat comprises at least one radial shoulder, i.e. an at least two-step hub seat. According to the invention, thus at least two polygonal reference surfaces are provided for each polygonal side.

Preferably, several radial shoulders and thus a multi-step hub seat are provided in the longitudinal direction of the shaft. Herein, the number of the radial shoulders or the hub seat steps results as a function of the length of the entire hub seat in the longitudinal direction of the shaft and of the application case. Herein, the individual hub seat steps preferably present the same length, i.e. the same axial extension in the longitudinal direction of the shaft.

The division of the hub seat into individual steps by providing individual radial shoulders is particularly advantageous because of the thus caused force distribution of the force acting on the shaft in the due application case. The maximum force acting on the shaft in the due application case as a consequence of a load on the shaft-hub connection will be namely distributed on the individual steps because of the division of the hub seat into these ones, in particular if pre-stresses are applied to the individual steps, wherein the pre-stresses are preferably different. Herein, the different pre-stresses are generated because of different over-dimensions. As a result, a force distribution advantageously results, which shows less maximum stresses in comparison to an only one-step hub seat. The great advantage of the embodiment according to the invention is thus that with a constant total stress of the shaft, an altogether reduced maximum stress value is achieved. Regions of the hub seat of the shaft which are especially stressed according to the state of the art can thus be relieved, which leads to a reduced maximum stress of the shaft. Thus, undesired high material tensions both in the shaft and in the hub region can be avoided, which is the reason for the fact that the shaft-hub connection has a considerably longer service life or a higher total output while having the same dimensions. For an unchanged service life in comparison to the state of the art, the design according to the invention permits a reduced dimensioning of the individual components, which leads to material saving. But the embodiment according to the invention in particular offers more constructional freedom and, depending on the respective application case, one can use considerably improved solutions with respect to the state of the art.

Another advantage in comparison to the state of the art in the form of for instance conical press seats results from the fact that the finishing accuracy which is required for a due use does not have to be so high. In particular in view of a precise location positioning in the longitudinal direction of the shaft this proves to be advantageous, because the efficacy of the connection is no more influenced by in particular axial tolerances in comparison to previously known conical-round press connections.

Altogether, the design according to the invention permits a distribution of the maximum forces or tensions which act upon the shaft to several shoulders such that an altogether equalized force or tension distribution can be achieved. This advantageously leads to reduced contact corrosion.

According to another aspect of the invention, the hub seat comprises a radial over-dimension with respect to the hub of the component. This over-dimension can be for instance comprised between 10 µm and 100 µm. Depending on the application case, a radial over-dimension comprised between 20 µm and 80 µm and still more preferred between 25 µm and 75 µm can be provided. In combination with the design according to the invention of the multi-step hub seat, such a radial over-dimension causes a still improved force or tension distribution. In a particular embodiment of the invention it can be provided that the radial over-dimension is different with respect to the individual steps of the hub seat. Thus, the first step of the hub seat can for instance have another over-dimension than the second, the third or the fourth step of the hub seat. The design having different over-dimensions with respect to the individual steps of the hub seat advantageously offers the constructional possibility to influence in a predeterminable way the force or tension distribution on the individual steps of the hub seat. Thanks to a correspondingly different configuration of the radial over-dimension with respect to the individual steps of the hub seat, it can be for instance assured that the steps of the hub seat which are placed at the ends with respect to the longitudinal extension of the shaft will be less stressed in the due load case than for example the intermediate steps of the hub seat with respect to the longitudinal extension of the shaft.

The design provided according to the invention relates to a polygonal connection between shafts and hubs in general and is not limited to certain shaft designs and/or component designs. In so far, the hub can be a separate or integral component of the component received by the shaft. According to the invention, it is only a matter of the design of the actual connection between the shaft on the one hand and the hub on the other hand. The invention is variable in several respects. The working title "polygonal connection" very generally refers to non-round connections, i.e. symmetrical or asymmetrical polygons, ellipses, tooth systems, protuberances and like non-circular designs. The term "radial shoulder" designates at least one step-like radial jump. Different steps can be combined with each other, i.e. cylindrical, conical, conical-conical, cylindrical-cylindrical and the like. The transition steps or shoulders can be radial, rounded, conical and the like. Also here, all combinations are comprised by the invention.

Furthermore, it is sufficient if a radial shoulder is formed on one of the cooperating components. Depending on the application case, the shoulders can be formed successively with corresponding over-dimensions, in order to provoke optimum force conditions.

Finally it can be provided according to the invention that successive polygons are extending in an offset manner around the longitudinal axis of the shaft. In the simple imaginable case of a pentangular polygon for instance, a second polygon step following a first polygon step can be offset by a very small angle. This causes further improvements with respect to the force transmission.

BRIEF DESCRIPTION OF THE DRAWINGS

Other advantages and characteristics will become apparent from the following description by means of the figures. Herein:

FIG. 1a shows a force distribution curve with respect to the shaft-hub connection according to FIG. 1;

FIG. 2a shows a force distribution curve with respect to the shaft-hub connection according to FIG. 2;

FIG. 4 shows a further embodiment of the hub/shaft connection; and

FIG. 5 shows yet another embodiment of the hub/shaft connection.

DETAILED DESCRIPTION OF THE DISCLOSURE

Figure 1:
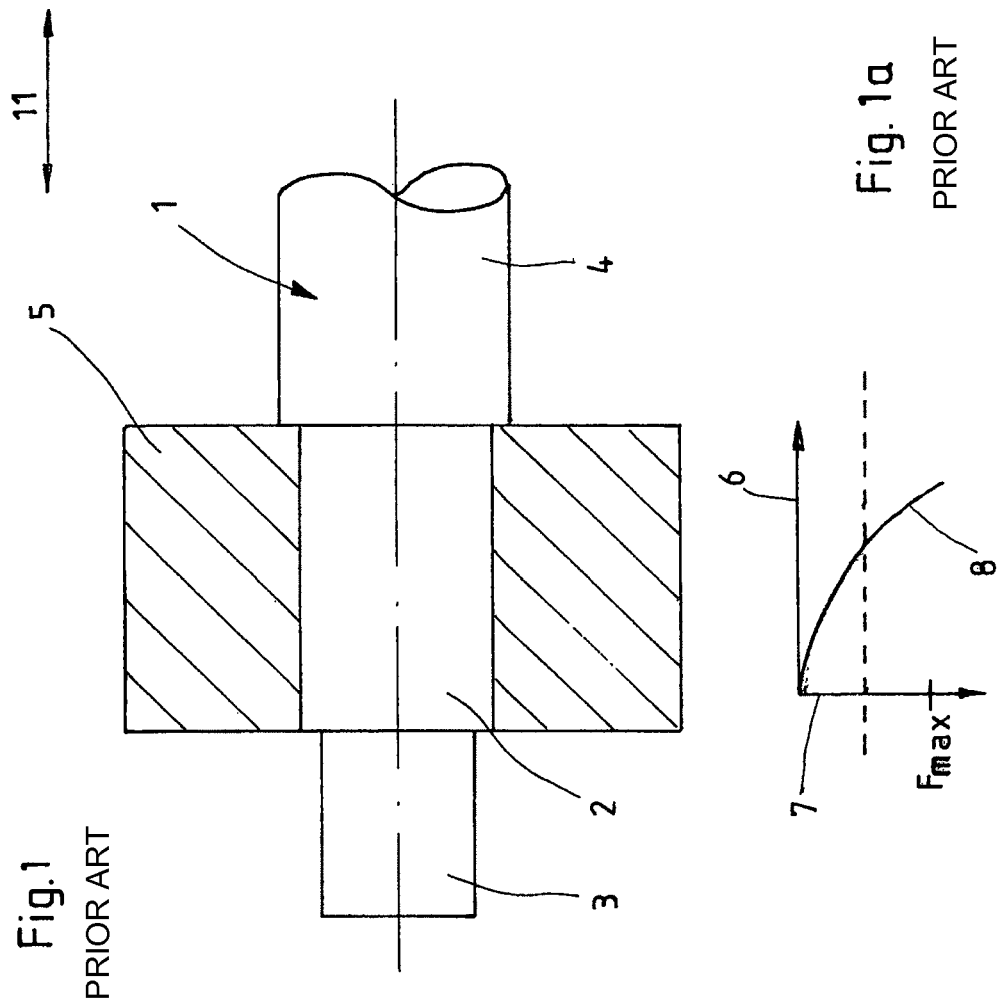
FIG. 1 shows a schematic representation of a shaft-hub connection according to the state of the art.

In FIG. 1 a shaft-hub connection having a hub seat 2 provided by a shaft 1 and a hub of a component 5 which is received by the hub seat 2 is shown. The hub seat 2 and the hub of the component 5 form a polygonal connection, i.e. the hub seat 2 has an external contour presenting a polygonal cross section, wherein the component 5 comprises a receiver which is for instance a boring and has an internal contour that is correspondingly formed with respect to the external contour of the hub seat 2. The utilized polygonal profile can be for instance a pentagon. Principally it is of course true that the polygonal profile as non-round profile can have as many corners as correspond to the need. In so far the invention is not limited to a pentagonal polygonal profile.

As it is visible in the representation according to FIG. 1, the hub seat 2 and the component 5 received by it have the same length in the longitudinal direction 11 of the shaft 1 or they have the same width with respect to the sheet plane according to FIG. 1. With respect to the drawing plane according to FIG. 1, the hub seat 2 is limited on the left side as well as on the right side by respectively a joining area 3 or a joining area 4, which joining areas 3 and 4 have a circular cross section in contrast to the hub seat 2.

The shaft-hub connection represented in FIG. 1 is one according to the state of the art. A shaft-hub connection according to the invention is shown in FIG. 2.

Figure 2:
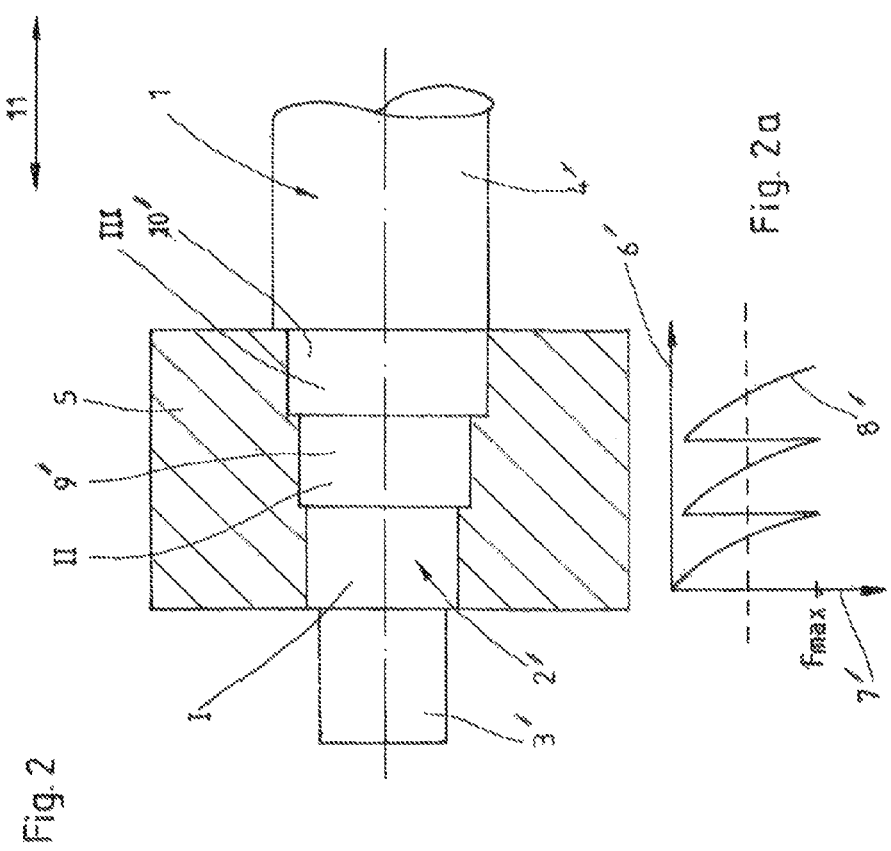
FIG. 2 shows a schematic representation of a shaft-hub connection according to the invention.

As it is visible in the representation according to FIG. 2, the hub seat 2' comprises two radial shoulders 9' and 10' in the shown exemplary embodiment, such that in total a three-step hub seat 2' having three steps I, II and III is formed. The hub of the component 5' is designed corresponding to the multi-step design of the hub seat 2' according to the invention.

The individual steps I, II and III of the hub seat have the same width with respect to the drawing plane according to FIG. 2, i.e. they have the same length with respect to the longitudinal direction 11' of the shaft 1.

The radial shoulder 9' which forms the second step II of the hub seat 2' projects over the first step I of the hub seat 2 in the radial direction by at least some µm up to several millimeters, depending on the embodiment and the application case. In the same way, the third step III formed by the radial shoulder 10' projects over the second step II of the hub seat 2 provided by the radial shoulder 9' in the radial direction.

Figure 3:
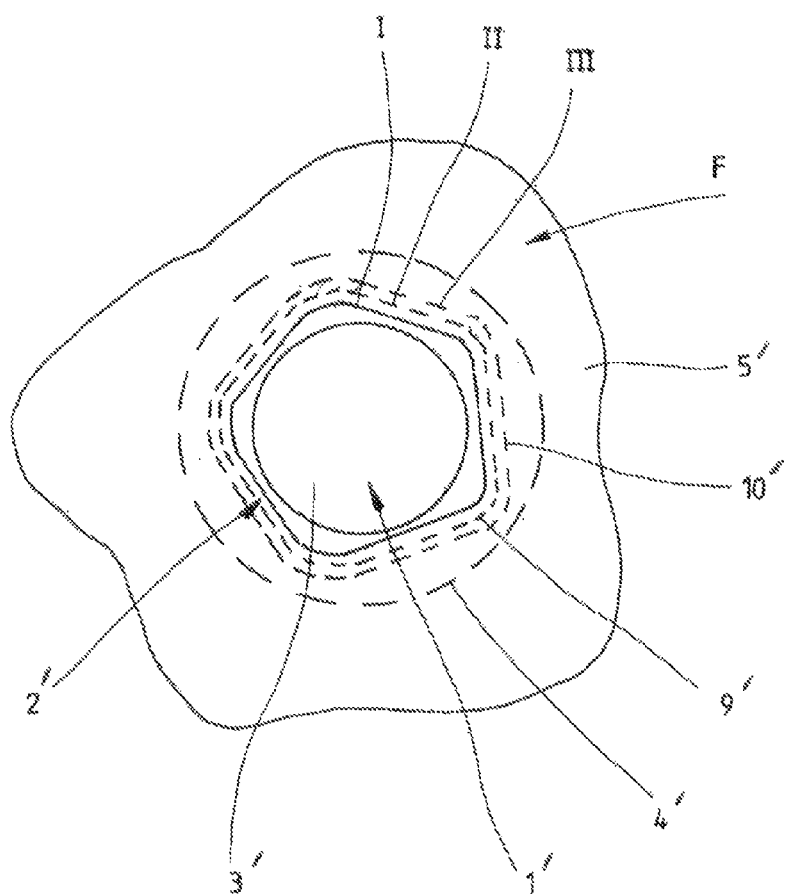
FIG. 3 shows a schematic representation of the shaft-hub connection according to the invention in line of sight III according to FIG. 2.

FIG. 3 shows the shaft-hub connection in line of sight III according to FIG. 2. In this representation, the individual radial shoulders 9' and 10' or the individual steps I, II and III of the hub seat are well visible. This representation in particular shows that the hub seat 2' forms a pentangular polygonal profile, whereas the joining areas 3' and 4' which are adjacent to the hub seat 2' on the left and on the right side with respect to the representation according to FIG. 2 have circular cross sections.

If in the case of load a force acts upon the component 5' on the right side of the same one with respect to the drawing plane according to FIG. 2, as it is shown by means of the force arrow F, the shaft 1' will be stressed in the region of the hub seat 2', as it is exemplarily shown in FIG. 2a. FIG. 2a shows a diagram which shows the force and tension distribution 8' in the region of the hub seat 2' of the shaft 1', wherein the force introduced into the shaft 1 is laid off as y-axis 7' over the axial extension of the hub seat 2' according to the x-axis 6'. As it is disclosed by this diagram, a force or tension progression 8' results, which, with reference to the drawing plane according to FIG. 2, increases from the left side to the right side depending on step I, II and III of the hub seat 2'. The maximum load is respectively achieved on the right side of each step I, II and III of the hub seat 2° with respect to the drawing plane according to FIG. 2.

At this point it should be emphasized that FIGS. 1a and 2a only serve for illustrating explanations and shall not be in any way scientifically technically correct.

The force peaks furthermore define an average force, which approximately corresponds to the mean value between 0 and $F_{max}$ 12. This average force is the measuring tool for the efficiency of the shaft-hub connection and this mean value is drawn in as dashed line.

For a shaft-hub connection according to the state of the art, a force or tension distribution 8' results as shown in FIG. 1a. A comparison of the diagrams according to FIG. 1a and FIG. 2a shows that either the force which is altogether introduced into the hub seat 2' is equally high, but that a force distribution with respect to the maximally acting force to the individual steps I, II and III of the hub seat 2' is achieved according to the design according to the invention. Or the other way round, the shaft-hub connection according to the invention can be more loaded and can transmit a higher average force. This leads to the result that in the embodiment according to the invention a minimized maximum load acts upon the shaft 1' in comparison to the state of the art, and that with an equal force introduction. The minimization of the maximum load is achieved in that the maximum forces and/or tensions are distributed to the individual steps I, II and III of the hub seat 2' according to the embodiment according to the invention. Thanks to this tension distribution an improved, i.e. reduced contact corrosion can be obtained in comparison to the state of the art. Or the shaft-hub connection according to the invention can be alternatively regarded as clearly more efficient, which means that it is a considerable improvement in every respect.

As it is visible in the representation according to FIG. 4, in which the successive radial sections are offset by an angle, the hub seat 2" includes two radial shoulders 9" and 10" in the shown exemplary embodiment, such that in total a three-step hub seat 2" having three steps I', II' and III' is formed. The hub of the component 5" is designed corresponding to the multi-step design of the hub seat 2" according to the invention. As in the previous embodiment, joining areas 3" and 4''' of the shaft 1"" are adjacent to the hub seat 2''' on the left and on the right side.

LIST OF REFERENCE NUMERALS

1 shaft
2 hub seat/shaft-hub connection
3 joining area
4 joining area
5 component
6 x-axis
7 y-axis
8 force distribution
9 radial shoulder
10 radial shoulder
11 longitudinal direction
I step
II step
III step
F force
$F_{max}$ maximum force

The invention claimed is:

1. A shaft-hub connection, comprising:
   a shaft including a hub seat; and
   a hub of a component, which is received by the hub seat, wherein said hub seat and said hub o form a non-circular connection with each other,
   wherein the hub comprises at least a first hub section and a second hub section; wherein the hub seat comprises at least one radial shoulder that defines at least two hub seat sections longitudinally offset from each other and having different radial dimensions, the at least two hub seat sections including a first hub seat section extending continuously from the radial shoulder in a first direction and a second hub seat section extending continuously from the radial shoulder in a second opposite direction,
   wherein the respective first and second hub seat sections are mated with corresponding first and second hub sections,
   wherein the first hub seat section is radially over-sized with respect to the first hub section by a first predetermined amount, and
   wherein the second hub seat section is radially over-sized with respect to the second hub section by a second predetermined amount; wherein the first predetermined amount is different that the second predetermined amount;
   wherein the first hub seat section is circumferentially angularly offset by a very small angle with respect to the second hub seat around the longitudinal direction of the shaft.

2. A shaft hub connection according to claim 1, wherein the radial shoulders provide substantially equally long hub seat sections in the longitudinal direction of the shaft.

3. A shaft-hub connection according to claim 1, wherein the predetermined amount is between 10 μm and 100 μm.

4. A shaft-hub connection according to claim 1, wherein the hub is separate from the shaft and is an integral component of the component received by the shaft.

5. A shaft-hub connection according to claim 1, wherein the radial sections are tapered.

6. A shaft-hub connection according to claim 1, wherein the radial shoulders provide radial steps, wherein at least one of the radial steps is conical.

7. A shaft-hub connection according to claim 1, wherein the at least two hub seat sections further comprise a third hub seat section,
   where the second hub seat section is circumferentially angularly offset with respect to the third hub seat section around the longitudinal direction of the shaft.

* * * * *